(12) United States Patent
Mitsui

(10) Patent No.: US 7,927,889 B2
(45) Date of Patent: Apr. 19, 2011

(54) METHOD FOR MANUFACTURING FERROELECTRIC MEMORY DEVICE AND FERROELECTRIC MEMORY DEVICE

(75) Inventor: Hiroyuki Mitsui, Suwa (JP)

(73) Assignee: Seiko Epson Corporation (JP)

( * ) Notice: Subject to any disclaimer, the term of this patent is extended or adjusted under 35 U.S.C. 154(b) by 511 days.

(21) Appl. No.: 12/031,793

(22) Filed: Feb. 15, 2008

(65) Prior Publication Data

US 2008/0212358 A1    Sep. 4, 2008

(30) Foreign Application Priority Data

Feb. 19, 2007    (JP) .................................. 2007-038246

(51) Int. Cl.
*H01L 21/8239* (2006.01)

(52) U.S. Cl. ..................... 438/3; 257/295; 257/E21.664; 257/E27.104

(58) Field of Classification Search .................. 257/295, 257/E21.663, E21.664, E27.104; 438/3
See application file for complete search history.

(56) References Cited

U.S. PATENT DOCUMENTS

| | | | |
|---|---|---|---|
| 7,407,862 B2 * | 8/2008 | Tamura .......................... 438/396 |
| 7,459,361 B2 * | 12/2008 | Matsuura ....................... 438/239 |
| 7,514,272 B2 * | 4/2009 | Fukada et al. .................... 438/3 |
| 7,592,657 B2 * | 9/2009 | Wang ............................. 257/295 |
| 7,605,007 B2 * | 10/2009 | Wang ............................. 438/3 |
| 7,763,921 B2 * | 7/2010 | Wang ............................. 257/298 |
| 7,776,621 B2 * | 8/2010 | Wang ............................. 438/3 |
| 2003/0116849 A1 | 6/2003 | Suzuki et al. .................... 257/751 |
| 2004/0185579 A1 | 9/2004 | Fujiki |
| 2006/0157762 A1 | 7/2006 | Hikosaka et al. |
| 2007/0228431 A1 * | 10/2007 | Wang ............................. 257/295 |
| 2007/0275484 A1 * | 11/2007 | Mitsui ............................ 438/3 |
| 2008/0003700 A1 * | 1/2008 | Wang et al. ........................ 438/3 |
| 2008/0035970 A1 * | 2/2008 | Wang ............................. 257/295 |
| 2008/0061331 A1 * | 3/2008 | Wang et al. ..................... 257/295 |
| 2008/0073680 A1 * | 3/2008 | Wang ............................. 257/295 |
| 2008/0111172 A1 * | 5/2008 | Wang et al. ..................... 257/295 |
| 2008/0261332 A1 * | 10/2008 | Wang et al. ........................ 438/3 |
| 2008/0311683 A1 * | 12/2008 | Wang ............................. 438/3 |
| 2009/0026514 A1 * | 1/2009 | Wang ............................. 257/295 |
| 2009/0029485 A1 * | 1/2009 | Wang ............................. 438/3 |

FOREIGN PATENT DOCUMENTS

| | | |
|---|---|---|
| JP | 06-283605 | 10/1994 |
| JP | 2004-134692 | 4/2004 |
| JP | 2004-288696 | 10/2004 |
| JP | 2004-363151 | 12/2004 |
| JP | 2006-202848 | 8/2006 |
| JP | 2007-266023 | 10/2007 |

* cited by examiner

*Primary Examiner* — Anh Phung
*Assistant Examiner* — Michael Lulis
(74) *Attorney, Agent, or Firm* — Harness, Dickey & Pierce, P.L.C.

(57) ABSTRACT

A method for manufacturing a ferroelectric memory device includes: forming a conductive base layer above a substrate; and laminating above the base layer a first electrode, a ferroelectric layer and a second electrode, wherein, prior to the step of forming the base layer, the method includes forming an active element in the substrate, forming an interlayer dielectric film on the substrate, and forming a contact plug in the interlayer dielectric film, and wherein the step of forming the base layer includes: forming a first conductive layer composed of a conductive material having a self-orienting property on the interlayer dielectric film including the contact plug; planarizing the first conductive layer by a chemical mechanical polishing method thereby forming a planarized first conductive layer that covers the interlayer dielectric film including the contact plug; applying an ammonia plasma process to a surface of the planarized first conductive layer; forming a titanium layer on the planarized first conductive layer treated with the ammonia plasma process; and heat-treating the titanium layer in a nitrogen atmosphere thereby changing the titanium layer to a titanium nitride layer which forms a second conductive layer.

3 Claims, 3 Drawing Sheets

METHOD FOR MANUFACTURING FERROELECTRIC MEMORY DEVICE AND FERROELECTRIC MEMORY DEVICE

The entire disclosure of Japanese Patent Application No. 2007-038246, filed Feb. 19, 2007 is expressly incorporated by reference herein.

BACKGROUND

1. Technical Field

The present invention relates to a method for manufacturing a ferroelectric memory device and a ferroelectric memory device.

2. Related Art

Ferroelectric memory devices (FeRAM) are nonvolatile memory devices capable of low voltage and high-speed operation, and their memory cells can be each formed from one transistor and one capacitor (1T/1C). Accordingly, ferroelectric memory devices can achieve integration at the same level of that of DRAM, and are therefore expected as large-capacity nonvolatile memories.

To maximize the ferroelectric properties of the ferroelectric capacitors composing a ferroelectric memory device, the crystal orientation in each of the layers composing a ferroelectric capacitor is critical. In particular, to control the crystal orientation of the ferroelectric film, crystal orientation and flatness must be controlled from a lower electrode film disposed below the ferroelectric film. On the other hand, a stack structure, in which capacitors are formed on contact plugs connected to transistors, is known for improving the integration level of the capacitors, as described for example in Japanese Laid-open Patent Application JP-A-2004-134692.

In capacitors disposed in a stacked structure, a ferroelectric film is formed on two different surfaces, i.e., surfaces of a dielectric film and a contact plug, such that controlling the crystal orientations in these films is very important. Furthermore, step differences of recesses that are formed above the contact plugs cause a problem because they deteriorate the flatness and therefore damage the crystal orientation controllability. To address such a problem, the aforementioned document describes a technique which includes, after forming the contact plug, forming a conductive hydrogen barrier film over the whole surface of the contact plug, planarizing the whole surface by a CMP method until the recess is filled, and forming a lower electrode thereon.

However, if the conductive hydrogen barrier film composed of TiN or the like is merely planarized by a CMP method, like the aforementioned technique, a high resistance layer is formed at a surface layer portion of the conductive hydrogen barrier film when planarized due to the slurry used in this CMP method. In other words, when the slurry used in the CMP method is acidic, a thin oxide film is formed at a surface layer portion of the film after planarization, which forms a high resistance layer. Furthermore, even when the slurry is neutral, a very thin oxide film is formed at a surface layer portion of the film after planarization, which also forms a high resistance layer. Then, when the lower electrode of the capacitor is disposed on the high resistance layer thus formed, the resistance between the contact plug and the lower electrode elevates, which deteriorates the characteristics of the ferroelectric memory device.

SUMMARY

An advantage of some aspects of the invention is to provide a method for manufacturing ferroelectric memory devices which controls an elevation in the resistance between the contact plug and the lower electrode, and also favorably controls the crystal orientation in each of the layers composing the ferroelectric capacitor. Another advantage of some aspects of the invention is to provide a ferroelectric memory device obtained by the method.

An embodiment of the invention pertains to a method for manufacturing a ferroelectric memory device, the method including: forming a conductive base layer above a substrate; and laminating above the base layer a first electrode, a ferroelectric layer and a second electrode. Prior to the step of forming the base layer, the method includes forming an active element in the substrate, forming an interlayer dielectric film on the substrate, and forming a contact plug in the interlayer dielectric film. In one aspect, the step of forming the base layer includes forming a first conductive layer composed of a conductive material having a self-orienting property on the interlayer dielectric film including the contact plug, planarizing the first conductive layer by a chemical mechanical polishing method thereby forming a planarized first conductive layer that covers the interlayer dielectric film including the contact plug, applying an ammonia plasma process to the surface of the planarized first conductive layer, forming a titanium layer on the planarized first conductive layer treated with the ammonia plasma process, and heat-treating the titanium layer in a nitrogen atmosphere thereby changing the titanium layer to a titanium nitride layer which forms a second conductive layer.

According to the method for manufacturing a ferroelectric memory device, after the first conductive layer is formed on the interlayer dielectric film including the contact plug, the first conductive layer is planarized by a chemical mechanical polishing method (CMP method). Therefore, a high resistance layer is formed at the surface layer portion of the obtained planarized first conductive layer due to the slurry used in the CMP method. As the ammonia plasma process is applied to the surface of the planarized first conductive layer, this surface treatment process becomes more effective. More specifically, because the high resistance layer is composed of an oxide film or a hydroxide film, its surface is terminated with oxygen radicals (—O, =O) or hydroxyl radicals (—OH). Accordingly, when the ammonia plasma process is applied, $NH_3$ would more readily react with these radicals, for example, hydroxyl radicals would react with ammonia thereby more readily generating (—O—NH), whereby the surface of the high resistance layer would be more favorably modified by nitrogen.

As the high resistance layer is more effectively treated by the ammonia plasma process, and the titanium layer having self-orienting property is formed on the treated surface, the titanium layer exhibits better crystal orientation. In other words, because the high resistance layer is modified with nitrogen, the self-orienting property of the titanium layer formed thereon is strongly exhibited, and its (001) orientation is promoted. Accordingly, the second conductive layer, which is a titanium nitride layer obtained through heat-treating the titanium layer in a nitrogen atmosphere, has crystal structure having favorable crystal orientation with its crystal orientation being in (111). As a result, the base layer having the second conductive layer improves the crystal orientation of the first electrode that is formed on the base layer.

Furthermore, when the titanium layer is heat-treated in a nitrogen atmosphere to be changed into the titanium nitride layer, titanium in the titanium layer thermally diffuses in the high resistance layer. As a result, the resistance of the high resistance layer is lowered such that an elevation in the resistance between the contact plug and the first electrode (lower electrode) is suppressed, whereby the characteristics of the ferroelectric memory device can be prevented from deterioration.

Also, in the method for manufacturing a ferroelectric memory device described above, the first conductive layer may preferably be composed of titanium nitride. By so doing, the first conductive layer and the second conductive layer are composed of the same material, whereby the crystal orientation of the second conductive layer is further improved because the first conductive layer having the same crystal orientation is provided as the base.

Moreover, in the above-described manufacturing method, the step of forming the first conductive layer may preferably include applying an ammonia plasma process to the surface of the interlayer dielectric film including the contact plug, forming a titanium layer on the interlayer dielectric layer treated with the ammonia plasma process, and heat-treating the titanium layer in a nitrogen atmosphere to be changed to a titanium nitride layer that forms the first conductive layer. In this manner, by forming the first conductive layer in a manner similar as applied to the second conductive layer, the first conductive layer itself has better crystal orientation, which further improves the crystal orientation of the second conductive layer.

Furthermore, according to the above-described manufacturing method, in the step of forming the first conductive layer, a series of steps including applying the ammonia plasma process, forming the titanium layer and changing the titanium layer into a titanium nitride layer that forms the first conductive layer may preferably be repeated multiple times. By so doing, even when the thickness of the first conductive layer obtained by a single series of steps becomes relatively thin in consideration of the film quality, the thickness of the first conductive layer finally obtained can become relatively thick by repeating the series of steps. Accordingly, it is possible to secure a desired film thickness in the planarized first conductive layer that is obtained by planarizing the first conductive layer.

Also, the method for manufacturing a ferroelectric memory device described above may preferably include forming a barrier layer having a barrier property to oxygen as a topmost layer of the base layer. By forming such a barrier layer, oxidation of contact plugs or the like that may be formed in the substrate can be prevented or controlled.

As the barrier layer, for example, a compound expressed by, for example, $Ti_{(1-x)}Al_xN_y(0<x\leq0.3, 0<y)$ may be used. Such a compound has a (111) plane orientation reflecting the crystal orientation of the underlying titanium nitride layer, and the first electrode to be formed above has a predetermined plane crystal orientation reflecting the crystal orientation of the barrier layer.

A ferroelectric memory device in accordance with another embodiment of the invention includes: an active element formed on a substrate, an interlayer dielectric film covering the active element; a contact plug formed in the interlayer dielectric film; a conductive base layer formed on the interlayer dielectric film including the contact plug; and a ferroelectric capacitor having a first electrode, a ferroelectric layer and a second electrode laminated on the base layer. The base layer includes a first conductive layer composed of a conductive material having a self-orienting property which is formed on the interlayer dielectric film including the contact plug and planarized by a chemical mechanical polishing method, an intermediate layer that is formed at a surface layer portion of the first conductive layer and has bonds with nitrogen originated from oxygen and $NH_3$, and a second conductive layer formed on the intermediate layer, wherein the second conductive layer is a titanium nitride layer that is formed through heat-treating a titanium layer formed on the intermediate layer in a nitrogen atmosphere.

According to the ferroelectric memory device described above, the first conductive layer is planarized by a chemical mechanical polishing method (CMP method) such that the intermediate layer composed of a high resistance layer is formed at the surface layer portion of the first conductive layer due to the slurry used in the CMP method as described above. Then, for example, by applying an ammonia plasma process to the surface of the planarized first conductive layer, bonds with nitrogen originated from oxygen and $NH_3$ are formed in the intermediate layer, and its surface is modified by nitrogen. Because the surface is modified by nitrogen, when a titanium layer having self-orienting property is formed on this processed surface, the titanium layer has more favorable crystal orientation, and the second conductive layer composed of a titanium nitride layer obtained through heat-treating the titanium layer in a nitrogen atmosphere has a crystal structure having favorable crystal orientation. As a result, the first electrode formed on the base layer that has the second conductive layer has improved crystal orientation, and the ferroelectric layer having the first electrode as a base has also improved crystal orientation.

Also, when the titanium layer is changed into a titanium nitride layer by heat-treatment in a nitrogen atmosphere, titanium in the titanium layer thermally diffuses in the intermediate layer. Therefore, the resistance of the intermediate layer is lowered such that an elevation in the resistance between the contact plug and the first electrode (lower electrode) is suppressed, whereby the characteristics of the ferroelectric memory device can be prevented from deterioration.

DESCRIPTION OF EXEMPLARY EMBODIMENTS

Preferred embodiments of the invention are described in detail below.

Ferroelectric Memory Device

Figure 1:
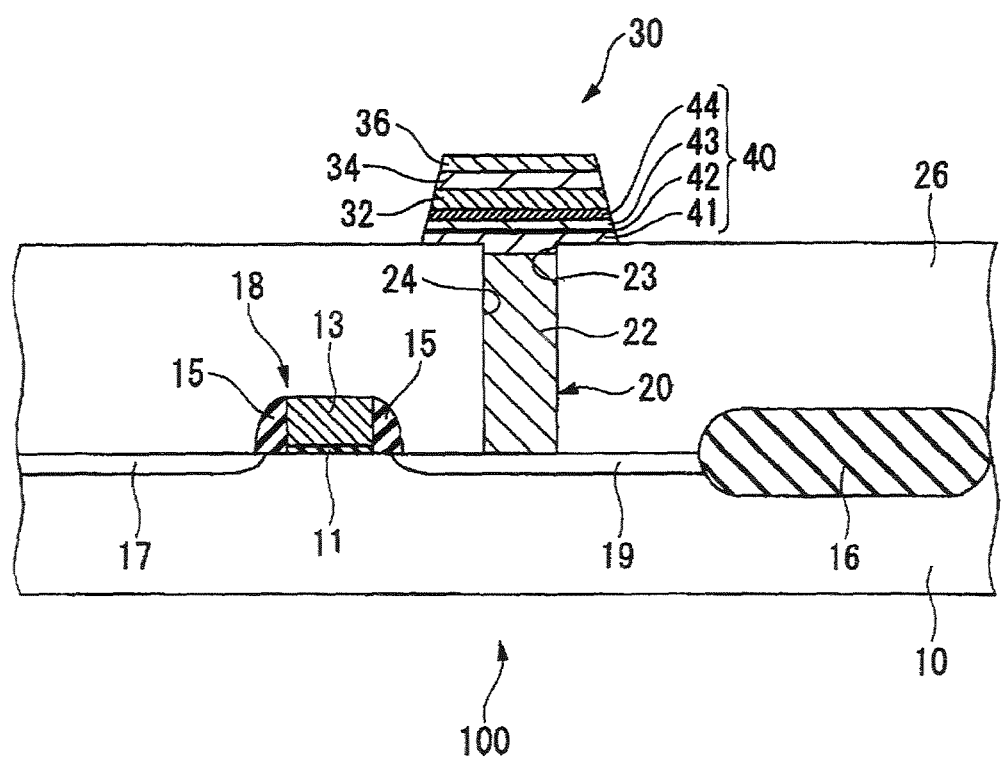
FIG. 1 is a schematic cross-sectional view of a ferroelectric memory device in accordance with an embodiment of the invention.

FIG. 1 is a schematic cross-sectional view of a ferroelectric memory device in accordance with an embodiment of the invention. Reference numeral 100 in FIG. 1 denotes the ferroelectric memory device. The ferroelectric memory device 100 includes, above a semiconductor substrate 10 (hereafter referred to as a substrate), a ferroelectric capacitor 30, a plug (contact plug) 20, and a switching transistor 18 (hereafter referred to as a transistor) of the ferroelectric capacitor 30, which are formed in a stacked structure. The present embodiment is described with reference to a 1T/1C type memory cell, but the applicability of the invention is not limited to a 1T/1C type memory cell.

The transistor 18 includes a gate dielectric layer 11, a gate conductive layer 13 provided on the gate dielectric layer 11, first and second impurity regions 17 and 19 which are source region and drain region, respectively. Also, an interlayer dielectric film 26 composed of silicon oxide ($SiO_2$) or the like covering the transistor 18 is formed on the substrate 10, and a plug 20 is formed in the interlayer dielectric film 26.

The ferroelectric capacitor 30 is provided on the interlayer dielectric film 26 and is disposed on the plug 20. The ferroelectric capacitor 30 includes a base layer 40, a first electrode (lower electrode) 32 laminated on the base layer 40, a ferroelectric layer 34 laminated on the first electrode 32, and a second electrode (upper electrode) 36 laminated on the ferroelectric layer 34. Another interlayer dielectric film (not shown) covering the ferroelectric capacitor 30 is formed over the interlayer dielectric film 26.

The plug 20 is electrically connected to the transistor 18, and isolated by an element isolation region 16 from adjacent transistors (not shown). The plug 20 is formed on the second impurity region 19, and is formed from an opening section (contact hole) 24 and a plug conductive layer 22 provided inside the opening section 24. The plug conductive layer 22 may be made of any of high melting-point metal such as tungsten, molybdenum, tantalum, titanium, and nickel, and may preferably be made of tungsten (W) in particular. Therefore tungsten is used in the present embodiment. It is noted that an adhesion layer (not shown) composed of Ti or TiN for adhering the dielectric layer 26 that forms the inner wall surface of the opening section 24 and the plug conductive layer 22 may be provided according to the necessity.

A recess 23 is formed on the plug conductive layer 22 of the plug 20. The recess 23, which is formed in the manufacturing process, is a depression formed as the surface layer of the plug 20 is receded inside the interlayer dielectric film 26. The recess 23 is formed when the surface layer of the plug 20 is etched down to a predetermined depth away from the surface layer of the interlayer dielectric layer 26 in the manufacturing process. The depth is, for example, about 10-20 nm.

The base layer 40, which forms a portion of the ferroelectric capacitor 30, includes a first titanium nitride layer (planarized first conductive layer) 41 formed on the plug 20 in a manner to electrically connect to the plug conductive layer 22 of the plug 20, an intermediate layer 42 formed on the first titanium nitride layer 41, a second titanium nitride layer (second conductive layer) 43 formed on the intermediate layer 42, and a barrier layer 44 laminated on the second titanium nitride layer 43.

The first titanium nitride layer 41 is formed on the interlayer dielectric film 26 in a state in which a portion thereof fills the recess 23. The first titanium nitride layer 41 is formed primarily for embedding the recess 23. The first titanium nitride layer 41 is planarized by a chemical mechanical polishing method (CMP method) in order to remove the depression that reflects the recess 23. After the planarization process, the first titanium nitride layer 41 is formed to have a thickness of about 20 nm on the interlayer dielectric film 26. It is noted that the first titanium nitride layer 41 is amorphous on the dielectric layer 26, and oriented to the plane crystal orientation (111). However, the first titanium nitride layer 41 has a microcrystal structure with almost no crystal orientation on the plug 20 (i.e., on the inside of the recess 23), and has no predetermined plane orientation.

The intermediate layer 42 is formed from a high resistance layer as a precursor that is formed as a result of planarizing the first titanium nitride layer 41, as described above, and is a very thin film. More specifically, when planarized by a CMP method, the first titanium nitride layer 41 forms a very thin oxide film or hydroxide film at its surface layer portion after planarization because the surface layer portion is oxidized or hydroxylated by the slurry used, as described above. The oxide film or hydroxide film forms a high resistance layer. Such an oxide film or hydroxide film is terminated with oxygen radicals (—O, =O) or hydroxyl radicals (—OH).

Also, this high resistance layer has bonds with nitrogen originated from oxygen and ammonia ($NH_3$), such as, for example, (—O—NH) which is generated through reaction of ammonia with the oxygen radicals or hydroxyl radicals (—OH). By this, the surface of the high resistance layer is modified by nitrogen. Furthermore, the high resistance layer contains titanium that is diffused in a thermal diffusion treatment to be described below, and forms the intermediate layer 42 whose resistance is lowered by the diffused titanium.

The second titanium nitride layer 43 is formed on the intermediate layer 42 that is treated with an ammonia plasma process to be described below, and therefore is favorably oriented to the plane crystal orientation (111). The second titanium nitride layer 43 is a titanium nitride layer that is formed through changing a titanium layer formed on the intermediate layer 42 by heat-treating the titanium layer in a nitrogen atmosphere, as described below.

The barrier layer 44 may be made of any material containing crystalline, having conductivity and oxygen barrier property, wherein the crystalline preferably has the crystal orientation (111). The material for the barrier layer 44 includes, for example, TiAlN, TiAl, TiSiN, TiN, TaN, and TaSiN, and the barrier layer 44 may preferably be a layer that contains titanium, aluminum, and nitrogen (TiAlN).

In the case in which the barrier layer 44 is made of TiAlN, the composition ratio (the atomic ratio) among titanium, aluminum, and nitrogen of the barrier layer 44 is $0<x\leq0.3$, and preferably $0<y$ assuming that the composition of the barrier layer 44 is represented by means of the chemical formula $Ti_{(1-x)}Al_xN_y$. Furthermore, to form the first electrode 32 having crystal orientation reflecting the crystal orientation of the barrier layer 44 on the barrier layer 44, the film thickness of the barrier layer 44 may preferably be 50 nm to 200 nm.

When the barrier layer 44 contains any crystalline material, the barrier layer 44 may preferably be oriented to the crystal orientation (111). The crystal orientation (111) of the barrier layer 44 enables the first electrode 32 with crystal orientation reflecting that of the barrier layer 44 to be formed above the barrier layer 44, whereby the first electrode 32 can be favorably oriented to the crystal orientation (111).

The first electrode 32 may be made of at least one kind of metal selected from a group of platinum, ruthenium, rhodium, palladium, osmium, and indium, or any of the oxides or alloys of these metals, preferably of platinum or iridium, more preferably iridium. The first electrode 32 may be either a single layer film or a laminated multilayer film. When the first electrode 32 contains any crystalline material, the first electrode 32 and the barrier layer 44 preferably have the crystal orientations in the epitaxial growth direction at the interface between them. In this case, the ferroelectric layer 34 and the first electrode 32 also preferably have the crystal orientations in the epitaxial growth direction at the interface between them.

In the case where the barrier layer 44 belongs to a cubic system and has crystal orientation (111), or belongs to a hexagonal system and has crystal orientation (001), the first electrode 32 preferably has the crystal orientation (111). In this configuration, it is easier for the ferroelectric layer 34 to have the crystal orientation (111) when forming the ferroelectric layer 34 on the first electrode 32.

The ferroelectric layer 34 contains a ferroelectric material. The ferroelectric material has a perovskite type crystal structure represented by a general formula $A_{1-b}B_{1-a}X_aO_3$, where the element A contains Pb. A part of Pb may be replaced with La. The element B is composed of at least one of Zr and Ti.

The element X is composed of at least one of V, Nb, Ta, Cr, Mo, W, Ca, Sr, and Mg. As the ferroelectric material contained in the ferroelectric layer 34, any of known materials, which can be used for ferroelectric layers, may be used. For example, $(Pb(Zr,Ti)O_3)(PZT)$, $SrBi_2Ta_2O_9$ (SBT), and $(Bi, La)_4Ti_3O_{12}$(BLT) may be enumerated. Above all, PZT is preferable for the material of the ferroelectric layer 34. In this case, the first electrode 32 may preferably be made of iridium from the viewpoint of device reliability.

When PZT is used for the ferroelectric layer 34, the content of titanium in PZT is preferably more than that of zirconium to acquire a greater amount of spontaneous polarization. PZT having such a composition belongs to a tetragonal system and has its spontaneous polarization axis along its c-axis. In this case, since a component having the crystal orientation along an a-axis intersecting with the c-axis simultaneously exists, the component having the crystal orientation along the a-axis does not contribute to polarization inversion when PZT is oriented to the c-axis orientation, such the ferroelectric properties may be deteriorated. In contrast, PZT used for the ferroelectric layer 34 may have the crystal orientation (111) to displace the a-axis by a predetermined angle from its reference normal. In other words, the polarization axis has a component in the direction of the reference normal, thereby contributing to polarization inversion. Accordingly, when the ferroelectric layer 34 is made of PZT, which contains more titanium than zirconium, PZT preferably has the crystal orientation (111) from the viewpoint of better hysteresis characteristic being achieved.

The second electrode 36 may be made of any of the materials exemplified above that are usable for the first electrode 32, or of aluminum, silver, nickel, or the like. The second electrode 36 may be either a single layer film or a laminated multilayer film. It is preferable that the second electrode 36 be made of platinum, or a laminate of iridium oxide and iridium films.

Method for Manufacturing Ferroelectric Memory Devices

Next, a method for manufacturing a ferroelectric memory device 100 having such a composition is described with reference to FIGS. 2A to 3D. In FIGS. 2A to 2E and FIGS. 3A to 3D, only the area neighboring the interlayer dielectric film 26 and the plug 20 of the ferroelectric memory device 100 in FIG. 1 are shown, for simplifying the description.

Figure 2A:
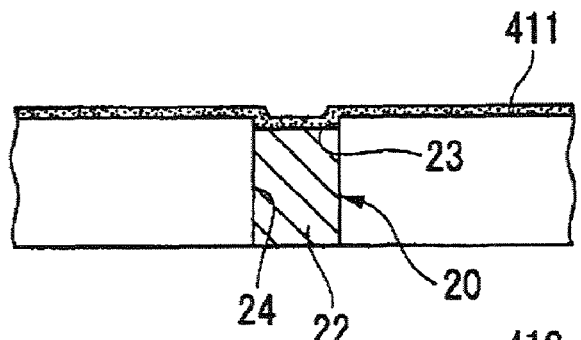
FIGS. 2A to 2E are schematic cross-sectional views showing a process for manufacturing the ferroelectric memory device in FIG. 1.

First, prior to forming the base layer 40, a transistor (active element) 18 is formed on a substrate 10 by a known technique, and an interlayer dielectric film 26 is formed on the substrate 10 including the transistor 18. Then, an opening section (contact hole) 24 is formed in the interlayer dielectric film 26 by dry etching or the like, and a plug 20 is formed by embedding a plug conductive layer 22 that electrically conducts with the transistor 18 inside the contact hole 24 (see FIG. 1). The plug conductive layer 22 may be embedded by, for example, a CVD method or a sputtering method. The plug conductive layer 22 formed on the top surface of the dielectric layer 26 is removed by, for example, a CMP method, thereby forming the plug 20. As shown in FIG. 2A, in this instance, a recess 23, which is a depression of the plug conductive layer 22 at a predetermined depth away from the surface layer of the interlayer dielectric film 26, is formed on the plug 20. The interlayer dielectric film 26 is made of silicon oxide ($SiO_2$) and the plug conductive layer 22 is made of tungsten (W).

Next, an ammonium plasma process is applied to the interlayer dielectric film 26 containing the aforementioned plug 20. More specifically, ammonium gas plasma is excited and radiated onto the interlayer dielectric film 26 containing the plug 20 described above. This ammonium plasma process is applied under the conditions with, for example, 1 Torr to 5 Torr of chamber pressure, 300° C. to 500° C. of substrate temperatures, 200 W to 2000 W of plasma power, and 30 seconds to 180 seconds of plasma radiation time duration. By the ammonium plasma process described above, the substrate surface (the surface of the interlayer dielectric film 26) excluding the area on the plug conductive layer 22 is modified with nitrogen.

Then, a film of titanium is formed to the thickness of about 20 nm by a sputtering method or the like on the interlayer dielectric film 26 including on the plug conductive layer 22 (inside the recess 23), thereby forming a titanium layer 411 as shown in FIG. 2A. Titanium, which has generally high self-orientation characteristic, forms a layer having a hexagonal close-packed structure with crystal orientation (001) when deposited into a film by a sputtering method or the like. Accordingly, the titanium layer 411 obtained formed on the amorphous interlayer dielectric layer 26 exhibits the crystal orientation (001) because of its self-orientation characteristic. On the other hand, though the ammonium plasma process is performed, the first titanium layer 411 is affected by the crystal structure of the plug conductive layer 22 on the plug 20, does not exhibit a favorable orientation (001), and exhibits random-ordered orientations.

Figure 2B:
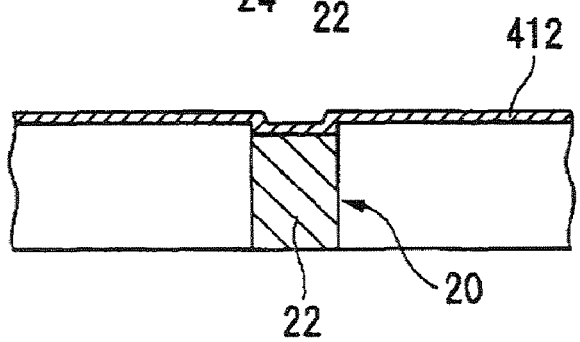

Next, a nitriding process is applied to the formed titanium layer 411 to change the titanium layer 411 into a titanium nitride layer 412, as shown in FIG. 2B. More particularly, RTA process (rapid thermal anneal process) is applied to the titanium layer 411 at about 500° C. to 650° C. in a nitrogen atmosphere, thereby nitriding the titanium layer 411.

A heat treatment temperature exceeding 650° C. may affect the characteristics of the transistor 18, while the heating temperature under 500° C. takes longer time to nitride the first titanium layer 411, both of which are not desirable. In such a nitriding process, the part of the titanium nitride layer 412 with crystal orientation (001) on the interlayer dielectric layer 26 changes its crystal direction to (111), while the part thereof on the plug conductive layer 22 remains in random-ordered orientations.

Figure 2C:
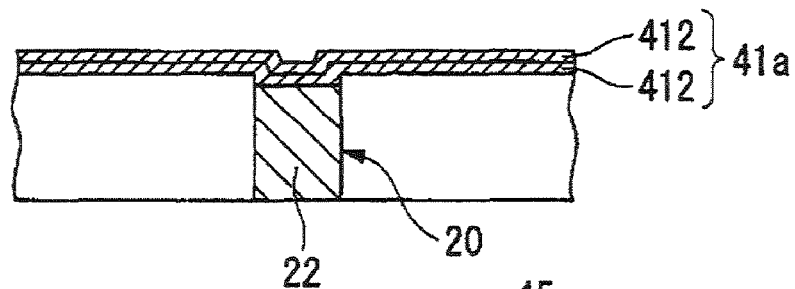

Then, a series of processings including the steps of applying an ammonia plasma process to the titanium nitride layer 412, forming a titanium layer 411, changing the titanium layer 411 to a titanium nitride layer 412 by RTA process in a nitrogen atmosphere is repeated once more, thereby forming a first conductive layer 41a composed of the titanium nitride layers 412 laminated in two layers, as shown in FIG. 2C.

By repeating the series of processings once more in this manner, the first conductive layer 41a composed of the laminate of the titanium nitride layers 412 becomes thick to a thickness of about 40 nm, even the individual titanium nitride layer 412 is formed thin to a thickness of about 20 nm in consideration of the film quality. Accordingly, even when the first conductive layer 41a is polished for planarization as described below, the obtained planarized first conductive layer secures a desired film thickness.

Also, by forming the other titanium nitride layer 412 on the previously formed titanium nitride layer 412 by the similar process, the titanium nitride layer 412 in the upper layer is influenced by the crystal structure of the titanium nitride layer 412 in the base layer. In other words, the layer is favorably oriented to the crystal orientation (111) on the titanium nitride layer 412 that is oriented to (111). On the other hand, the titanium layer formed on the titanium nitride layer 412 having randomly ordered orientations above the plug conductive layer 22 is oriented to the crystal orientation (001) because of its self-orienting property, which is further changed to the crystal orientation (111) by the nitrization step. This means that the repeated process of forming the titanium nitride layers 412 may clear any effects by the crystal structure of the plug conductive layer 22, thereby improving the crystallinity of the layer on the plug conductive layer 22.

Figure 2D:
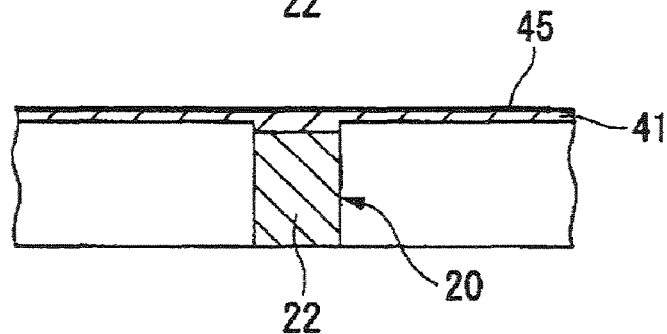

Next, the formed first conductive layer 41a is polished by a CMP (chemical mechanical polishing) method, thereby eliminating the depression caused by the recess 23 as shown in FIG. 2D. As a result, the first conductive layer 41a is planarized and becomes a planarized first conductive layer of about 20 nm in thickness, which provides a first titanium nitride layer 41 that secures the desired thickness as described above.

Also, by the planarization process using the CMP method, a high resistance layer 45 is formed at the surface layer portion of the planarized first conductive layer described above, in other words, on the first titanium nitride layer 41. The high resistance layer 45 is made of an oxide film or a hydroxide film formed at the surface layer portion of the planarized first conductive layer due to the slurry used in the CMP method, as described above, and is a very thin film of about 1 to 3 nm in thickness.

Figure 2E:
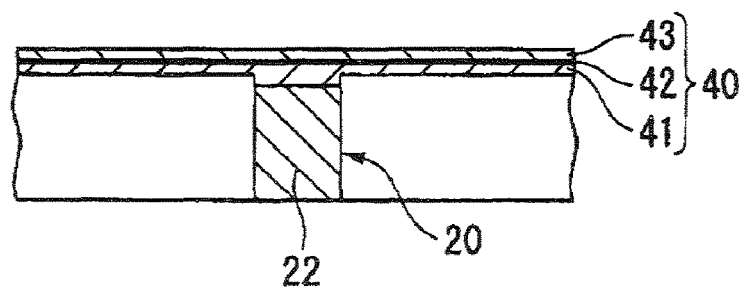

Then, a second titanium nitride layer 43 is formed on the planarized first conductive layer (on the surface of the high resistance layer 45) by the process of forming the titanium nitride layer 412 described above. More concretely, a series of processings including the steps of applying an ammonia plasma process to the high resistance layer, forming a titanium layer, changing the titanium layer to a titanium nitride layer by RTA process in a nitrogen atmosphere is conducted, thereby forming the second titanium nitride layer 43, as shown in FIG. 2E.

By forming the second titanium nitride layer 43 in this manner, in particular by the application of the ammonia plasma process, the surface of the high resistance layer 45 can be favorably modified with nitrogen. In other words, since the high resistance layer 45 is composed of an oxide film or a hydroxide film, its surface is terminated with oxygen radicals (—O, =O) or hydroxyl radicals (—OH). Accordingly, when the ammonia plasma process is applied, $NH_3$ would more readily react with these radicals. For example, hydroxyl radicals would react with ammonia thereby more readily generating (—O—NH).

As the high resistance layer 45 is more effectively treated by the ammonia plasma process, and the titanium layer having self-orienting property is formed on the treated surface, the titanium layer exhibits better crystal orientation. In other words, because the high resistance layer 45 is modified with nitrogen, the self-orienting property of the titanium layer formed thereon is strongly exhibited, and its (001) crystal orientation is promoted. Accordingly, the second titanium nitride layer 43, which is obtained by treating the titanium layer in a nitrogen atmosphere by the RTA process to be changed into a titanium nitride layer, has a crystal structure having favorable crystal orientation with its crystal orientation being in (111).

Furthermore, when the titanium layer is treated by the RTA process in a nitrogen atmosphere to be changed into the titanium nitride layer, titanium in the titanium layer thermally diffuses in the high resistance layer. As a result, the resistance of the high resistance layer 45 is lowered, and becomes an intermediate layer 42 having a relatively high conductivity, as shown in FIG. 2E. Because the high resistance layer 45 is originally a thin layer, an elevation in the resistance between the plug 20 and the first electrode sandwiching the intermediate layer 42 can be controlled. In particular, in the PTA process in forming the second titanium nitride layer 43, a heating temperature may preferably be set to about 650° C. In this manner, by setting the RTA process temperature at higher temperatures within the range that does not affect the characteristic of the transistor 18, titanium can be more favorably, thermally diffused in the high resistance layer.

Figure 3A:
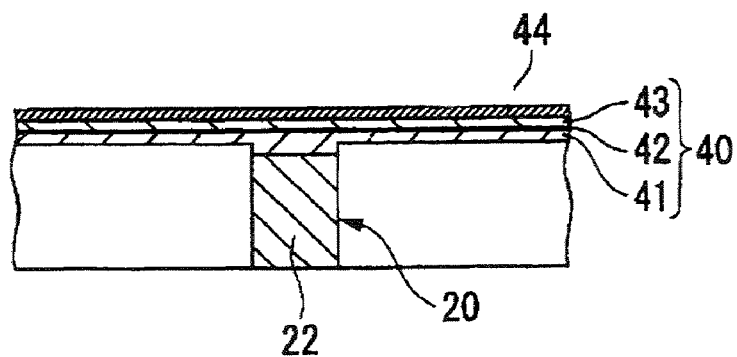
FIGS. 3A to 3D are schematic cross-sectional views showing the manufacturing process succeeding the step shown in FIG. 2D.

Next, as shown in FIG. 3A, a barrier layer 44 is formed on the second titanium nitride layer 43. By this, the barrier layer 44 having the crystal orientation (111), which reflects the crystal orientation (111) of the second titanium nitride layer 43 having favorable orientation, can be formed. This means that, at the interface between the second titanium nitride layer 43 and the barrier layer 44, the barrier layer 44 is formed through epitaxial growth because the lattice structure of the second titanium nitride layer 43 and the lattice structure of the barrier layer 44 match each other.

The method of forming the barrier layer 44 may be selected as needed depending on the material used, and for example, sputtering and CVD methods may be enumerated. As described above, the barrier layer 44 preferably has a crystalline characteristic and more preferably with crystal orientation (111), such that the barrier layer 44 in accordance with the present embodiment may be made of TiAlN with crystal orientation (111), which includes titanium, aluminum and nitrogen. As a result, the barrier layer 44 has the crystal orientation (111), and thus the crystal orientation of a first electrode 32 to be described below can be set to the crystal orientation (111). Accordingly, a ferroelectric layer 34 to be formed on the first electrode 32 can be made to have the crystal orientation (111).

As described above, when the ferroelectric layer 34 is composed of PZT, and the content of titanium in PZT is greater than the content of zirconium, PZT preferably has the crystal orientation (111), in view of its excellent hysteresis property. Accordingly, by forming the barrier layer 44 to have the crystal orientation (111), the first electrode 32 and the ferroelectric layer 34 can also be made to have the crystal orientation (111), and therefore the ferroelectric capacitor 30 with excellent hysteresis characteristics can be obtained. The substrate temperature is not particularly limited in forming the barrier layer 44 and may be appropriately selected between, for example, room temperature and 500° C.

Figure 3B:
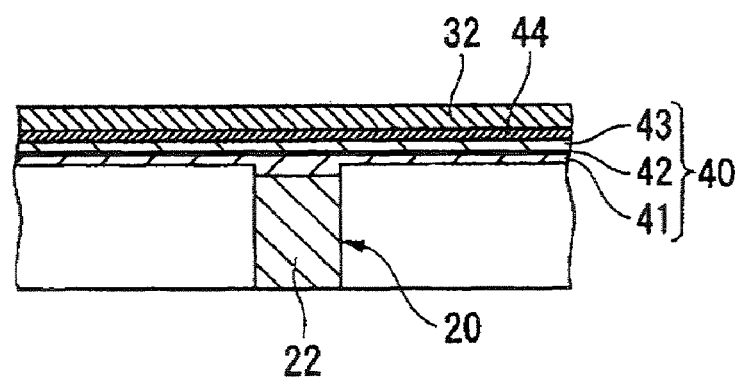

Next, as shown in FIG. 3B, the first electrode 32 is formed on the barrier layer 44. The formation of the first electrode 32 on the crystalline barrier layer 44 significantly improves the crystallinity of the first electrode 32 and enables the crystal orientation of the barrier layer 44 to be reflected in the first electrode 32. For example, when the barrier layer 44 has the crystal orientation (111), the first electrode 32 may be formed to have the crystal orientation (111). The method for forming the first electrode 32 may be appropriately selected depending on the material used, and includes, for example, the sputtering and CVD methods.

Figure 3C:
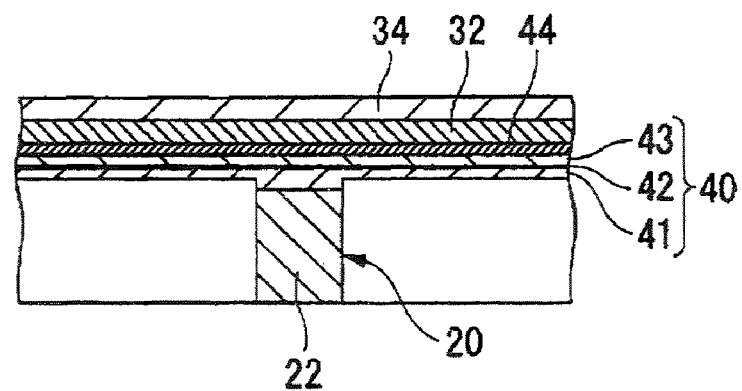

Next, as shown in FIG. 3C, the ferroelectric layer 34 is formed on the first electrode 32. By forming the ferroelectric layer 34 on the first electrode 32, the crystal orientation of the first electrode 32 can be reflected in the ferroelectric layer 34. For example, when at least a portion of the first electrode 32 is crystalline having the crystal orientation (111), the barrier layer 44 can be formed with its crystal orientation being in (111) orientation. The method for forming the ferroelectric layer 34 may be appropriately selected depending on the material used, and includes, for example, the spin-on method, the sputtering method and the MOCVD method.

Figure 3D:
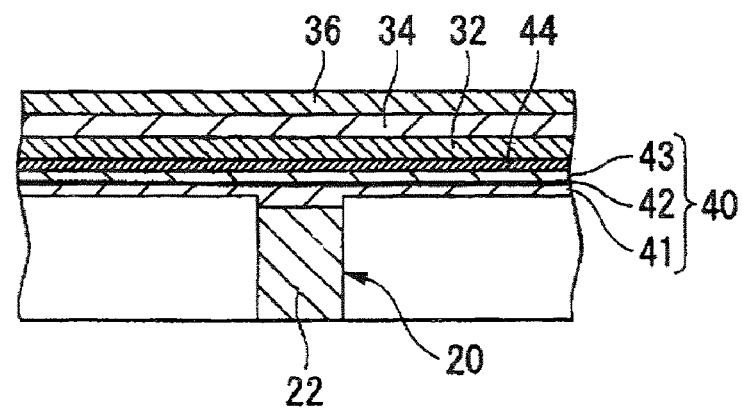

Then, as shown in FIG. 3D, the second electrode 36 is formed on the ferroelectric layer 34. The method for forming the second electrode 36 may be appropriately selected depending on the material used, and includes, for example, the sputtering method and the CVD method.

Then, a resist layer having a predetermined pattern is formed on the second electrode 36, and patterning is conducted by the photolithography method, using the resist layer as a mask. By this, as shown in FIG. 1, the stacked type ferroelectric capacitor 30 having the base layer 40, the first electrode 32 provided on the base layer 40, the ferroelectric layer 34 provided on the first electrode 32 and the second electrode 36 provided on the ferroelectric layer 34 can be formed, and the ferroelectric memory device 100 having the ferroelectric capacitor 30 can be obtained.

In accordance with the manufacturing method described above, the high resistance layer 45 is more effectively treated by the ammonia plasma process, and therefore the second titanium nitride layer 43 formed on the high resistance layer 45 (intermediate layer 42) can be made with excellent plane crystal orientation (111). Accordingly, the crystal orientation of the first electrode 32 that is formed on the base layer 40 having this second titanium nitride layer 43 can be improved, the ferroelectric layer 34 that is formed on the first electrode 32 can be made to have the favorable crystal orientation and the characteristics of the ferroelectric capacitor 30 can be improved.

Also, in the step of forming the second titanium nitride layer 43, when the titanium layer is treated with RTA process in a nitrogen atmosphere to be changed into the titanium nitride layer, titanium in the titanium layer can be thermally diffused into the high resistance layer 45, thereby forming the intermediate layer 42 with lowered resistance, such that an elevation in the resistance between the plug 20 and the first electrode 32 can be controlled, and deterioration of the characteristics of the ferroelectric memory device 100 can be prevented.

Also, as the barrier layer 44 having the crystal orientation (111) is provided, the first electrode 32 and the ferroelectric layer 34 can be readily made to have the crystal orientation (111). By this, the ferroelectric capacitor 30 having excellent hysteresis characteristics can be formed.

Also, in accordance with the ferroelectric memory device 100 manufactured by the manufacturing method described above, the ferroelectric capacitor 30 is formed with improved characteristics as the ferroelectric layer 34 is formed to have favorable crystal orientation, and deterioration in the characteristics, which could be originated from the high resistance layer 45, can be prevented as an elevation in the resistance between the plug 20 and the first electrode 32 is controlled.

The invention is not limited to the embodiments described above, and many changes can be made within the range that does not depart from the subject matter of the invention.

For example, according to the embodiments described above, the first titanium nitride layer 41 that defines a planarized first conductive layer is formed by laminating the titanium nitride layer 412 in two layers and then planarizing them. However, the first titanium nitride layer 41 can be formed in a single layer as long as the recess 23 can be favorably embedded, and a desired film thickness can be secured after the step of planarization by the CMP method.

Also, when the film thickness is desired to be made greater, the first titanium nitride layer 41 may be formed with titanium nitride layers 412 in three layers or more.

Also, the material of the planarized first conductive layer in accordance with the invention is not limited to titanium nitride as long as it is a conductive material having a self-orienting property, and other materials such as Ti, TiAlN and the like may also be used.

What is claimed is:

1. A method for manufacturing a ferroelectric memory device, the method comprising:
   forming a conductive base layer above a substrate; and
   laminating above the base layer a first electrode, a ferroelectric layer and a second electrode,
   wherein, prior to the step of forming the base layer, the method includes forming an active element in the substrate, forming an interlayer dielectric film on the substrate, and forming a contact plug in the interlayer dielectric film, and
   wherein the step of forming the base layer includes:
   forming a first conductive layer composed of a conductive material having a self-orienting property on the interlayer dielectric film including the contact plug;
   planarizing the first conductive layer by a chemical mechanical polishing method thereby forming a planarized first conductive layer that covers the interlayer dielectric film including the contact plug;
   applying an ammonia plasma process to a surface of the planarized first conductive layer;
   forming a titanium layer on the planarized first conductive layer treated with the ammonia plasma process; and
   heat-treating the titanium layer in a nitrogen atmosphere thereby changing the titanium layer to a titanium nitride layer which forms a second conductive layer,
   wherein the step of forming the first conductive layer includes applying an ammonia plasma process to the surface of the interlayer dielectric film including the contact plug, forming a titanium layer on the interlayer dielectric layer treated with the ammonia plasma process, and heat-treating the titanium layer in a nitrogen atmosphere to be changed to a titanium nitride layer that forms the first conductive layer; and
   in the step of forming the first conductive layer, a series of the steps including applying the ammonia plasma process, forming the titanium layer and changing the titanium layer into a titanium nitride layer that forms the first conductive layer is repeated multiple times.

2. A method for manufacturing a ferroelectric memory device according to claim 1, comprising forming a barrier layer having a barrier property to oxygen as a topmost layer of the base layer.

3. A method for manufacturing a ferroelectric memory device according to claim 2, wherein the barrier layer is composed of a compound expressed by $Ti_{(1-x)}Al_xN_y$ ($0<x\leq0.3$, $0<y$).

* * * * *